US009769958B2

(12) United States Patent
Jaskela et al.

(10) Patent No.: US 9,769,958 B2
(45) Date of Patent: Sep. 19, 2017

(54) MODULAR FAN AND MOTHERBOARD ASSEMBLY

(71) Applicant: Ciena Corporation, Hanover, MD (US)

(72) Inventors: Wayde Jaskela, Windsor, CA (US); Raleigh Bettiga, Penngrove, CA (US)

(73) Assignee: Ciena Corporation, Hanover, MD (US)

( * ) Notice: Subject to any disclaimer, the term of this patent is extended or adjusted under 35 U.S.C. 154(b) by 67 days.

(21) Appl. No.: 14/860,231

(22) Filed: Sep. 21, 2015

(65) Prior Publication Data

US 2017/0086332 A1    Mar. 23, 2017

(51) Int. Cl.
*H05K 7/20*    (2006.01)
*G06F 1/18*    (2006.01)
(Continued)

(52) U.S. Cl.
CPC ......... *H05K 7/20718* (2013.01); *G06F 1/184* (2013.01); *G06F 1/185* (2013.01); *G06F 1/20* (2013.01); *H05K 7/1489* (2013.01)

(58) Field of Classification Search
CPC . G06F 1/20; G06F 1/181; G06F 1/183; G06F 1/187; G06F 1/185; G06F 1/186; G06F 1/188; G06F 1/16; G06F 1/184; G06F 11/201; G06F 1/1632; G06F 1/206; G06F 1/1656; G06F 1/1679; G06F 1/203; H05K 7/20172; H05K 7/20727; H05K 7/20581; H05K 7/1487; H05K 7/20736; H05K 7/20145; H05K 7/1489; H05K 7/20181; H05K 7/20745; H05K 13/00; H05K 5/00; H05K 5/0221; H05K 7/02; H05K 7/1417; H05K 1/0201; H05K 1/181; H05K 3/00; H05K 5/04; H05K 7/1441; H05K 7/1444;
(Continued)

(56) References Cited

U.S. PATENT DOCUMENTS 5,471,099 A    11/1995 Larabell
5,562,410 A    10/1996 Sachs
(Continued)

FOREIGN PATENT DOCUMENTS

CN    101225826 A    7/2008

*Primary Examiner* — James Wu
*Assistant Examiner* — Michael Matey
(74) *Attorney, Agent, or Firm* — Clements Bernard Walker PLLC; Christopher L. Bernard; Lawrence A. Baratta, Jr.

(57) ABSTRACT

A chassis defines a slot for receiving a motherboard. The motherboard is insertable within the slot and further defines a plurality of fan module receivers along an edge thereof. Fan modules insert within the fan modules receivers and are removable and insertable while the motherboard is inserted within the chassis. The motherboard defines a plurality of edge connectors and connectors of the plurality of fan modules engage the edge connectors. Alignment posts mount to the motherboard opposite the edge connectors and the fan modules include slots that engage the alignment posts to align the connectors of the fan modules with the edge connectors. The chassis includes a midplane defining a plurality of expansion sockets on one side and one or more motherboard sockets on the other. The expansion sockets are arranged in a coplanar and collinear manner to enable a planar expansion card to simultaneously insert within multiple expansion sockets.

16 Claims, 14 Drawing Sheets

(51) Int. Cl.
*H05K 7/14* (2006.01)
*G06F 1/20* (2006.01)

(58) Field of Classification Search
CPC ............. H05K 7/1488; H05K 7/20136; H05K 7/20563; H05K 7/20645; H05K 7/20781; H05K 7/20809; F04D 29/646; F04D 25/166; F04D 29/601; G11B 33/142; G11B 33/12; Y02B 60/1275
See application file for complete search history.

(56) References Cited

U.S. PATENT DOCUMENTS

| | | | |
|---|---|---|---|
| 6,052,281 A | 4/2000 | Hardt | |
| 6,101,459 A | 8/2000 | Tavallaei | |
| 6,579,062 B2 | 6/2003 | Lu | |
| 6,592,327 B2 | 7/2003 | Chen | |
| 6,714,411 B2* | 3/2004 | Thompson | H05K 7/20581 165/104.33 |
| 6,795,314 B1* | 9/2004 | Arbogast | H05K 7/20172 165/104.33 |
| 6,999,313 B2* | 2/2006 | Shih | H05K 7/20172 165/104.33 |
| 7,054,155 B1* | 5/2006 | Mease | H05K 7/20581 165/104.34 |
| 7,352,574 B2* | 4/2008 | Chen | G06F 1/20 165/104.34 |
| 7,413,402 B2* | 8/2008 | Kang | H05K 7/20172 361/695 |
| 7,436,662 B2 | 10/2008 | Gundlach | |
| 7,466,545 B2* | 12/2008 | Hung | G06F 1/181 361/679.48 |
| 7,558,061 B2* | 7/2009 | Franz | F04D 29/646 361/694 |
| 7,639,496 B2 | 12/2009 | Lv | |
| 8,116,082 B2 | 2/2012 | Beaudoin | |
| 8,482,917 B2 | 7/2013 | Rose | |
| 8,727,750 B2 | 5/2014 | Lu | |
| 9,326,420 B2* | 4/2016 | Zhang | G06F 1/20 |
| 9,535,468 B2* | 1/2017 | Yu | G06F 1/185 |
| 2004/0256334 A1* | 12/2004 | Chen | H05K 7/20727 211/41.17 |
| 2006/0285292 A1* | 12/2006 | Fan | H05K 7/20172 361/695 |
| 2008/0148303 A1* | 6/2008 | Okamoto | G11B 33/126 720/652 |
| 2008/0253076 A1* | 10/2008 | Chen | G06F 1/186 361/679.31 |
| 2009/0147452 A1* | 6/2009 | Zhang | G06F 1/181 361/679.02 |
| 2013/0100613 A1* | 4/2013 | Nakai | H05K 7/20563 361/695 |
| 2013/0107436 A1* | 5/2013 | Li | H05K 7/1492 361/679.4 |
| 2014/0002986 A1* | 1/2014 | Guan | G06F 1/183 361/679.48 |
| 2014/0003010 A1* | 1/2014 | Lee | H05K 7/1485 361/759 |
| 2014/0085806 A1* | 3/2014 | Song | G06F 1/183 361/679.37 |
| 2014/0133087 A1* | 5/2014 | Chen | H05K 7/20727 361/679.33 |
| 2015/0146381 A1* | 5/2015 | Huang | H05K 7/20727 361/727 |
| 2015/0277516 A1* | 10/2015 | Farrow | G06F 1/188 361/679.31 |
| 2016/0044820 A1* | 2/2016 | Xu | H05K 7/20727 361/679.31 |
| 2016/0073554 A1* | 3/2016 | Marcade | G06F 1/18 211/26 |
| 2016/0165742 A1* | 6/2016 | Shen | H05K 7/1487 361/679.37 |

* cited by examiner

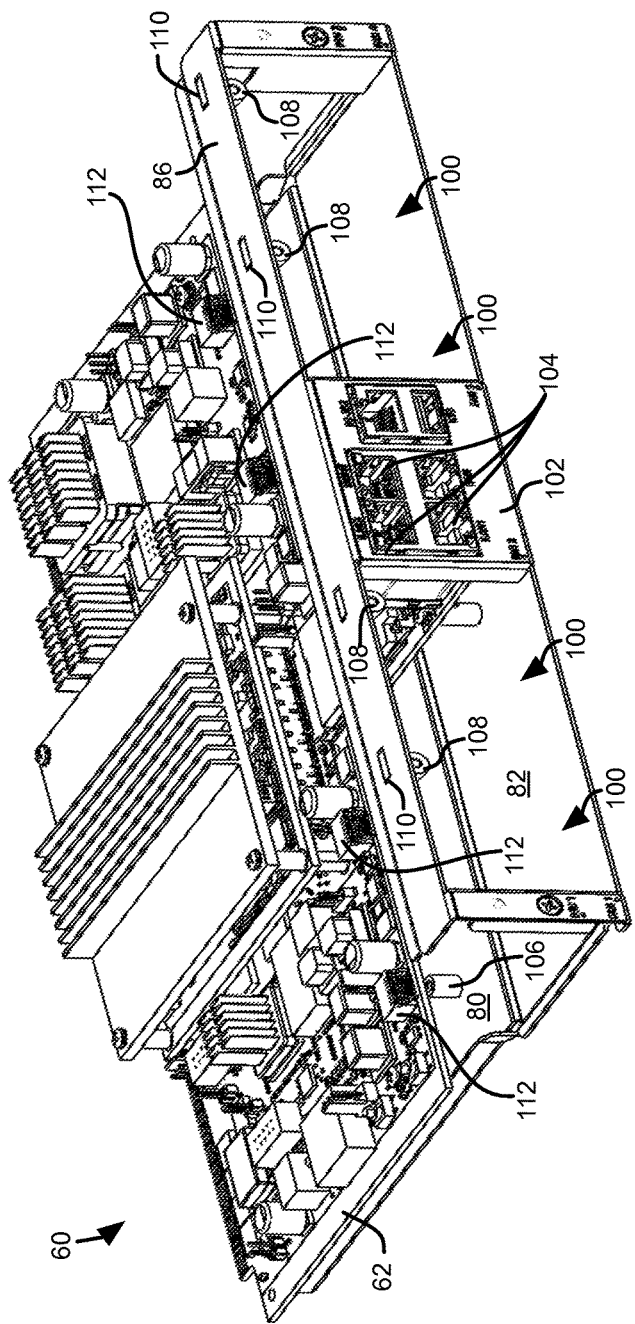
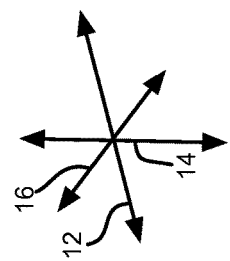
Fig. 7

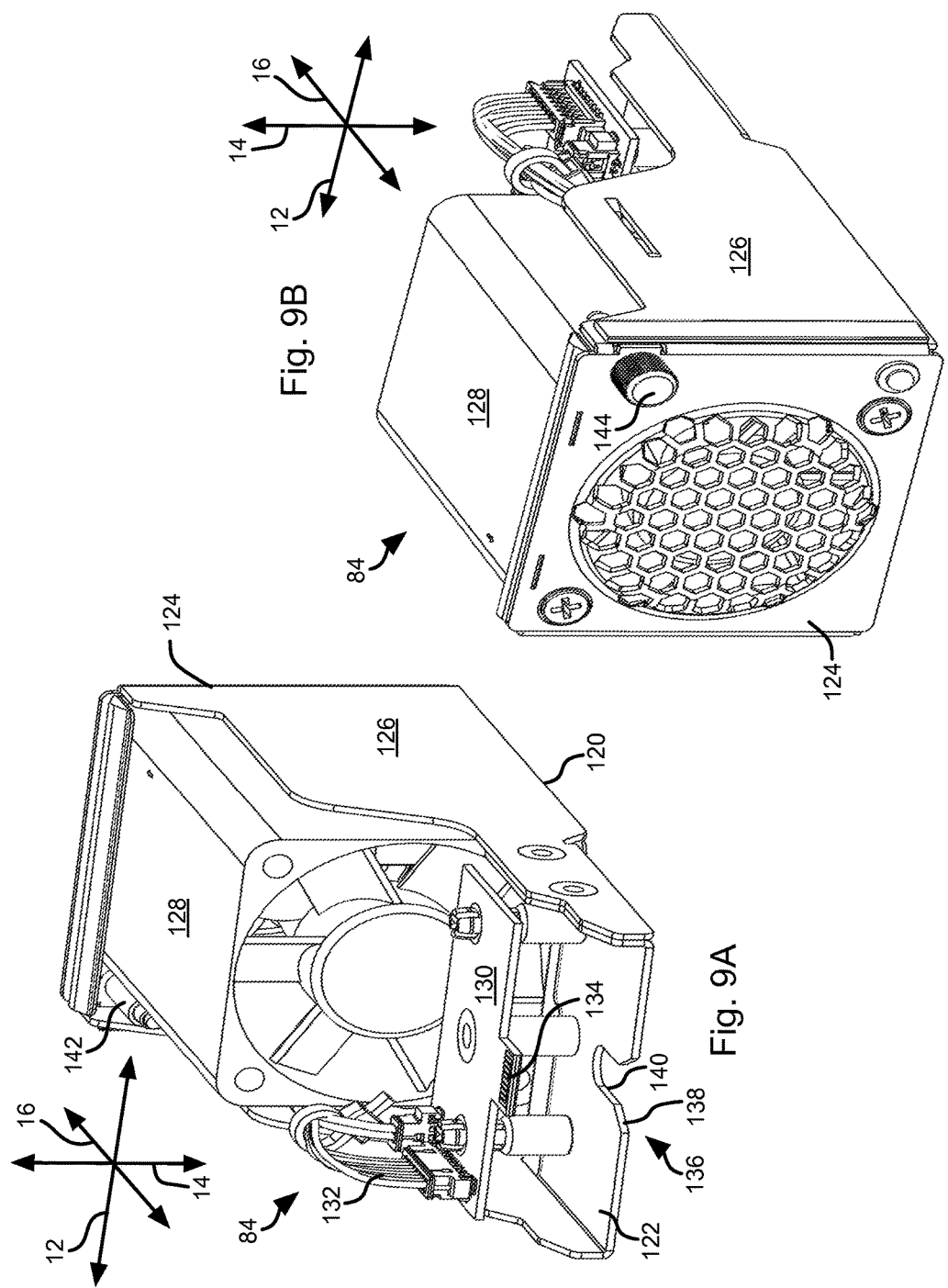

US 9,769,958 B2

MODULAR FAN AND MOTHERBOARD ASSEMBLY

BACKGROUND

Field of the Invention

This invention relates to systems and methods for interfacing a motherboard with one or more expansion cards, such as PCIe expansion cards.

Background of the Invention

Since the early days of computers, the basic system architecture has included a motherboard and one or more expansion slots. The motherboard includes the computer's most basic circuitry and components. For example, a motherboard typically included a central processing unit, memory (e.g. RAM), a basic input/output system (BIOS), the expansion slots, and interconnecting circuitry.

Expansion cards were originally used for many functions, such as audio processing, video processing, networking, and the like. Although many of these functions have been incorporated into the motherboard, expansion slots are still used for critical functions. In particular, routers, switches, and other high-performance networking components are often incorporated into expansion slots in rack-mounted servers.

Although the complexity of rack-mounted servers has increased, the basic problem of removing heat from the server remains. Typically, processors and other chips may have heat sinks mounted thereto. Airflow is then induced over the heat sinks by means of forced airflow or convection.

The systems and methods described herein provide an improved approach for ventilating a rack-mounted server.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIG. 7 is an isometric view of a motherboard for receiving fan modules in accordance with an embodiment of the present invention;

FIGS. 9A and 9B are isometric view of a fan module in accordance with an embodiment of the present invention;

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
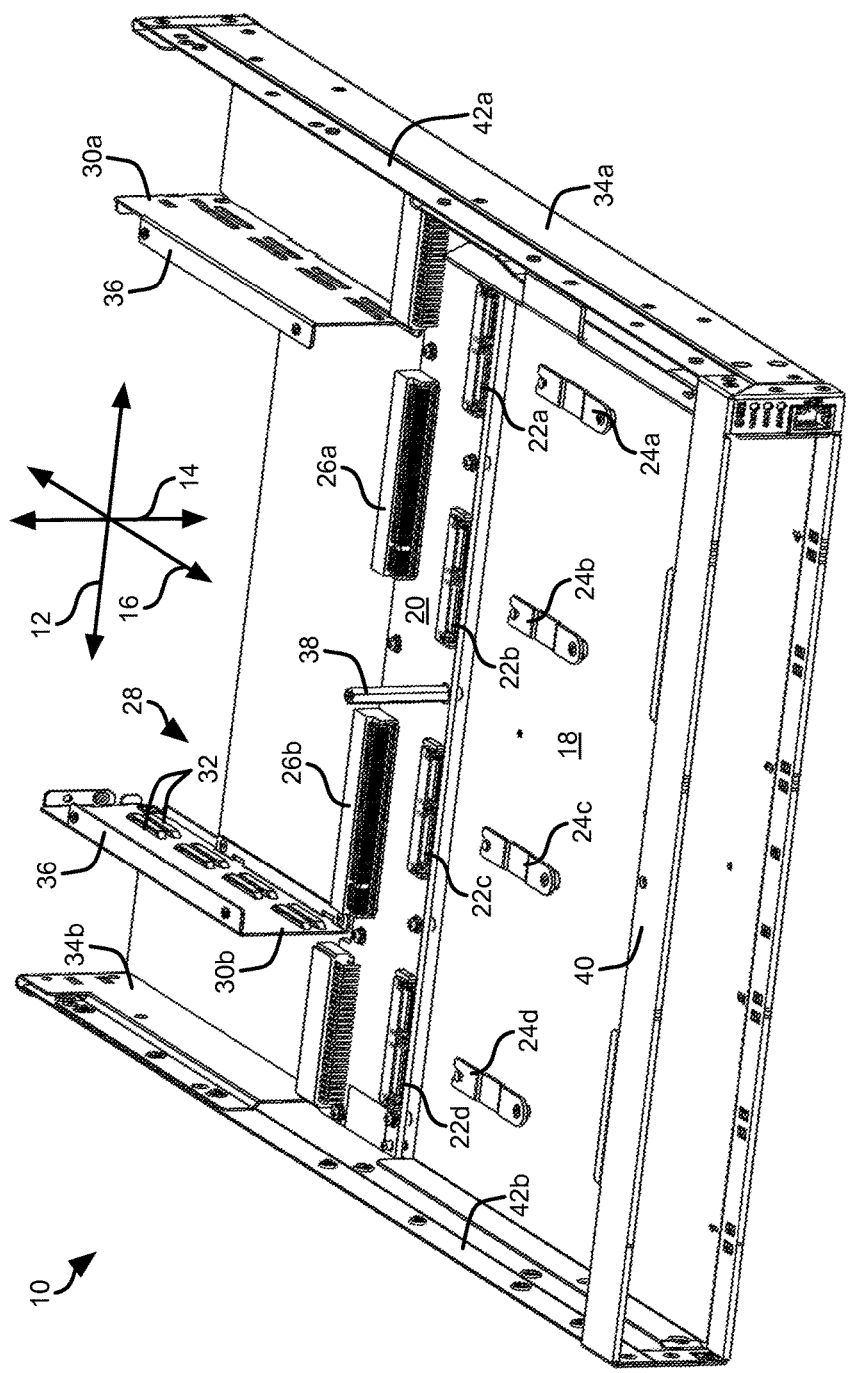
FIG. 1 is an isometric view of a chassis implementing a mid plane and mother board slot in accordance with an embodiment of the present invention.

Referring to FIG. 1, a chassis 10 may be sized to insert within a slot in a rack-mounted server and may define a securement interface known in the art for facilitating mounting. The chassis 10 may be understood with respect to a vertical direction 12, horizontal direction 14, and a longitudinal direction 16 that are mutually perpendicular. The vertical direction 12 corresponds to the direction of gravity. The horizontal direction 14 is perpendicular to the vertical direction and is parallel to a support surface on which the chassis 10 rests. A row of chassis 10 may be arranged along the horizontal direction 14 in rack. The longitudinal direction 16 is perpendicular to the vertical and horizontal directions 12, 14. Although various features are described herein with references to the vertical, horizontal, and longitudinal directions 12, 14, 16, these merely indicate relative position and orientation of components to one another. The chassis 10 may be placed in any orientation during use such that the vertical, horizontal, and longitudinal directions 12, 14, 16 may not correspond to absolute vertical, horizontal, or longitudinal directions, respectively, in some applications. For purposes of this disclosure a front of the chassis 10 is defined as the side into which expansion cards are inserted.

The chassis 10 includes a left plate 18 that is generally square or rectangular. A midplane 20 extends across the left plate 18 along the vertical direction 12 and may fasten directly to the left plate 18. The mid plane may span substantially the entire left plate 18 in the vertical direction 12, i.e. 80, 90, or 100 percent of the extent of the left plate 18 in the vertical direction 12.

A plurality of expansion sockets 22a-22d are mounted to the midplane 20. In the illustrated embodiment, the expansion sockets 22a-22d are PCIe sockets, however other socket types may be used. Likewise, although there are four expansion sockets 22a-22d in the illustrated implementation, more or fewer may be included. For example, 3, 6, 8, or some other number of expansion sockets 22a-22d may be implemented.

Front faces of the expansion sockets 22a-22d may abut a front edge of the midplane 20 or otherwise be positioned to receive an expansion card connector. Likewise, the front faces of the sockets 22a-22d may point towards the front of the chassis 10 along the longitudinal direction 16 and permit insertion of the connectors of expansion cards along an insertion direction that is also parallel to the longitudinal direction 16. The expansion sockets 22a-22d may be distributed along the vertical direction 12 with uniform spacing between adjacent sockets 22a-22d.

In some embodiments, the left plate 18 may define one or more detents 24a-24d that engage expansion cards inserted into the sockets 22a-22d and resist removal thereof. The detents 24a-24d may be embodied as leaf springs or any other detent mechanism known in the art.

The midplane 20 may include one or more motherboard sockets 26 that receive a connector of a motherboard. The midplane 20 may define wires and/or other components coupling pins of the expansion sockets 22a-22d to the pins of the motherboard sockets 26. For example, the pins of the expansion sockets 22a, 22b may be coupled to motherboard socket 26a and the pins of expansion sockets 22c, 22d may be coupled to motherboard socket 26b. However, in other embodiments, all of the pins of all of the expansion sockets 22a-22d are coupled to the pins of a single motherboard socket.

The faces of the motherboard sockets 26a, 26b may face an opposite direction from the faces of the expansion sockets 22a-22d, i.e. toward the back of the chassis 10 along the longitudinal direction 16. Likewise, the motherboard sockets 26a, 26b may permit insertion of a connector of a motherboard along an insertion direction that is parallel to the longitudinal direction 16. In some embodiments, the motherboard sockets 26a, 26b may face the same direction as the expansion sockets 22a-22d and be offset in the horizontal direction 14 to enable both to be occupied simultaneously.

The chassis 10 may define a motherboard receiver 28 for supporting a motherboard inserted into the motherboard sockets 26a, 26b. In the illustrated embodiment, the motherboard receiver 28 is defined by flanges 30a, 30b mounted to the left plate 18 along the longitudinal direction 16 and extending inwardly from the left plate 18 in the horizontal direction 14. The flanges 30a, 30b are offset from one another in the vertical direction 12 thereby defining a space to receive a motherboard. The flanges 30a, 30b may include pairs of tabs 32 distributed therealong in the longitudinal direction 16. The tabs 32 of a pair of tabs are spaced apart in the horizontal direction 14 in order to receive an edge of a circuit board. The tabs 32 of the flange 30a may project toward the flange 30b and the tabs 32 of the flange 30b may project toward the flange 30a. The tabs 32 may be defined by cutting and bending sheet metal from which the flanges 30a, 30b are formed. The pairs of tabs 32 may be replaced with any groove or channel that permits sliding of a circuit board along the longitudinal direction 14 and restrains movement in the horizontal direction 14.

The chassis may further include a bottom edge 34a and top edge 34b. The edges 34a, 34b may mount to opposite edges of the left plate 18 along the vertical direction 12. The edges 34a, 34b extend along the edges of the left plate 18 along the longitudinal direction and project inwardly from the left plate 18 along the horizontal direction 12. In some embodiments, edges 34a, 34b are formed monolithically with the left plate 18, such as by bending edges of the left plate 18 along creases extending in the longitudinal direction 16.

The chassis 10 may define covers for securing a right plate thereto. For example, the flanges 30a, 30b may define tabs 36 at a distal edge thereof, such as by bending the flanges 30a, 30b along a crease extending in the longitudinal direction 16. In some embodiments, a post 38 may secure to the mid plane 20, or pass through the mid plane 20 and secure to the left plate 18. The post 38 may define a threaded aperture for receiving a screw securing a right plate to the post 38. In some embodiments, an edge plate 40 extends across the bottom and top edges 34a, 34b in the vertical direction 12 at the front edge of the chassis 10. The edge plate 40 may be offset from the left plate 18 thereby defining an opening for receiving expansion cards inserted within the expansion sockets 22a-22d. The edge plate 40 may define an outer surface that is flush with a right plate secured to the edges 34a, 34b.

In some embodiments, the edges 34a, 34b may define inset portions 42a, 42b that are portions of the edges 34a, 34b that are offset inwardly along the vertical direction 12. The inset portions 42a, 42b may extend along some or all of the extent of the edges 34a, 34b in the longitudinal direction 16.

Figure 2:
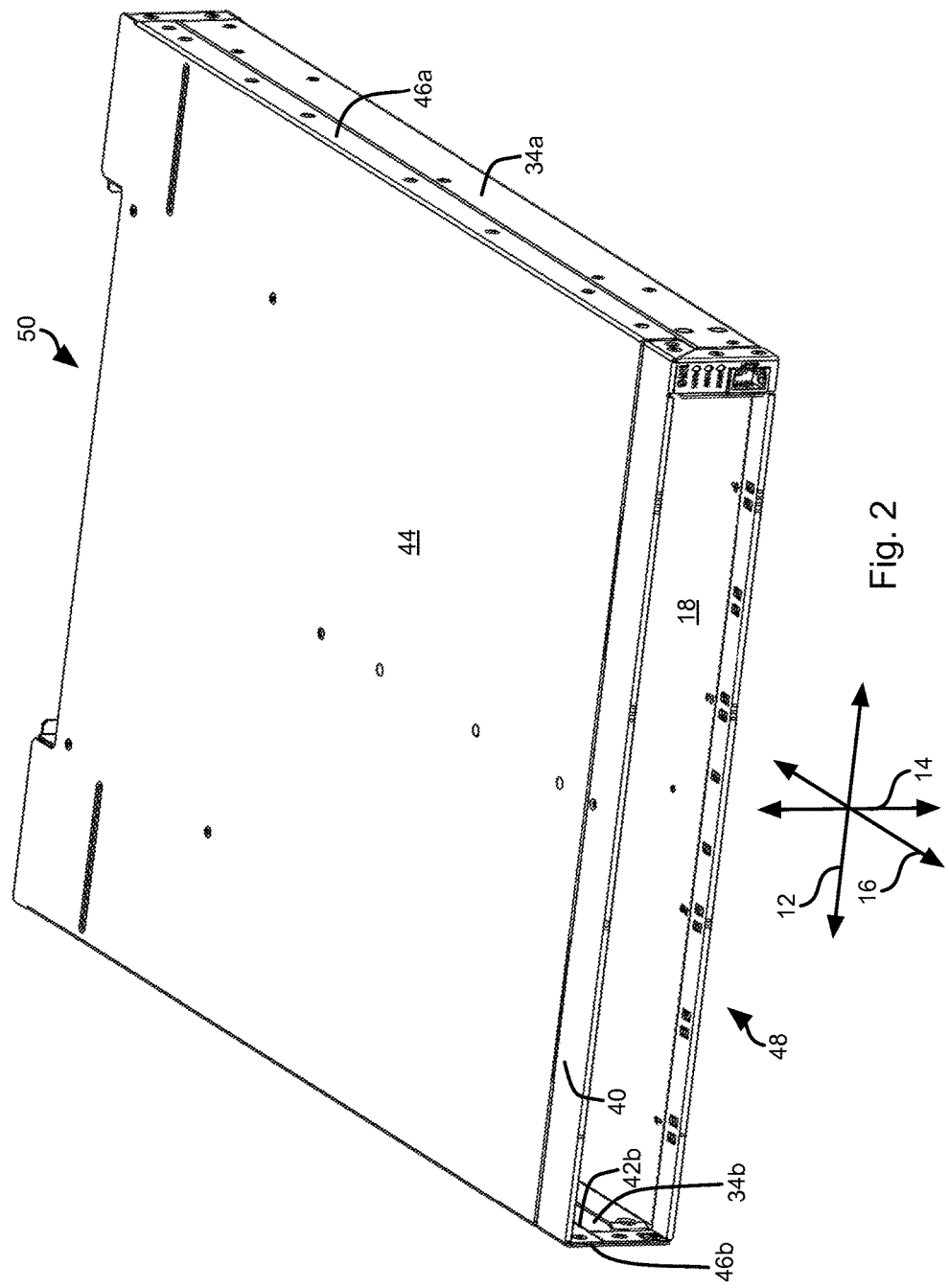
FIG. 2 is an isometric view of the chassis having a top plate attached.

Referring to FIG. 2, a right plate 44 may secure to the edges 34a, 34b as illustrated having edges 46a, 46b of the right plate positioned within the inset portions 42a, 42b of the edges 34a, 34b. As noted above, an upper surface of the right plate may be flush with the edge plate 40. With the right plate secured, an opening 48 may be defined at the front face of the chassis 10 for receiving expansion cards and an opening 50 is defined at the back face of the chassis 10 for receiving a motherboard.

Figure 3:
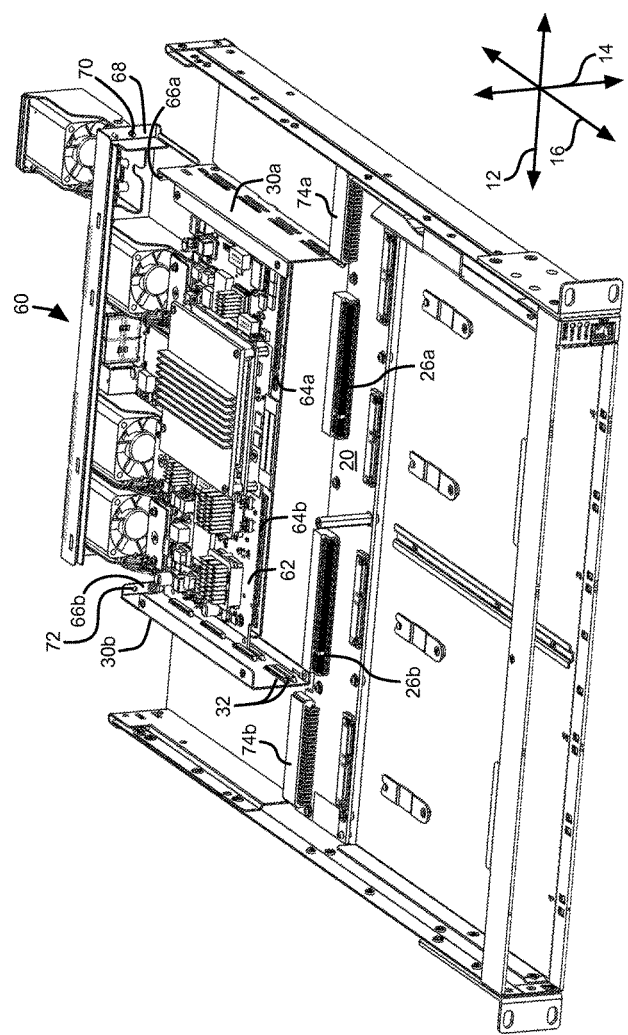
FIG. 3 is an isometric view illustrating insertion of a motherboard into the chassis in accordance with an embodiment of the present invention.

FIG. 3 illustrates the insertion of a motherboard 60 into the motherboard receiver 28. The right plate 44 is not shown to enable visualization of the insertion, however the motherboard may be inserted as shown when the right plate 44 is in place in the manner shown in FIG. 2. Likewise, the motherboard 60 may be inserted as shown when the chassis 10 is mounted within a rack.

As illustrated, a circuit board 62 of the motherboard 60 may insert between tabs 32 of the pairs of tabs and slide into the chassis 10 along the longitudinal direction. The circuit board 62 is oriented parallel to the vertical and longitudinal directions 12, 16 when inserted. The motherboard 60 is inserted until one or more connectors 64a, 64b insert within the motherboard sockets 26a, 26b. As is apparent in FIG. 3, the connectors 64a, 64b may be embodied as rows of contacts formed directly on the circuit board 62. However, other types of connectors 64a, 64b may also be implemented.

In some embodiments the flanges 30a, 30b may further define tabs 66a, 66b near the back edge of the chassis 10. The tabs may extend in the vertical and horizontal directions 12, 14 for securing to a face plate 68 secured to the circuit board 62. The faceplate 68 may be a sheet of material extending in the vertical and horizontal direction 12, 14. The face plate 68 may define apertures 70 positioned corresponding to apertures 72 in the tabs 66a, 66b enabling securement of the face plate 68 to the tabs 66a, 66b.

The motherboard 60 may define its own power supply. In the illustrated embodiment, power supply sockets 74a, 74b may be coupled to the midplane 20. The midplane 20 may define wires and circuits coupling power from the sockets 74a, 74b to the motherboard connectors 26a, 26b and to the expansion sockets 22a-22d. As shown in FIG. 3 a space between the flange 30a and the bottom edge 34a may be sized to receive a power supply coupled to the socket 74a. Likewise, a space between the flange 30b and the top edge 34b may receive a power supply coupled to the socket 74b.

Figure 4:
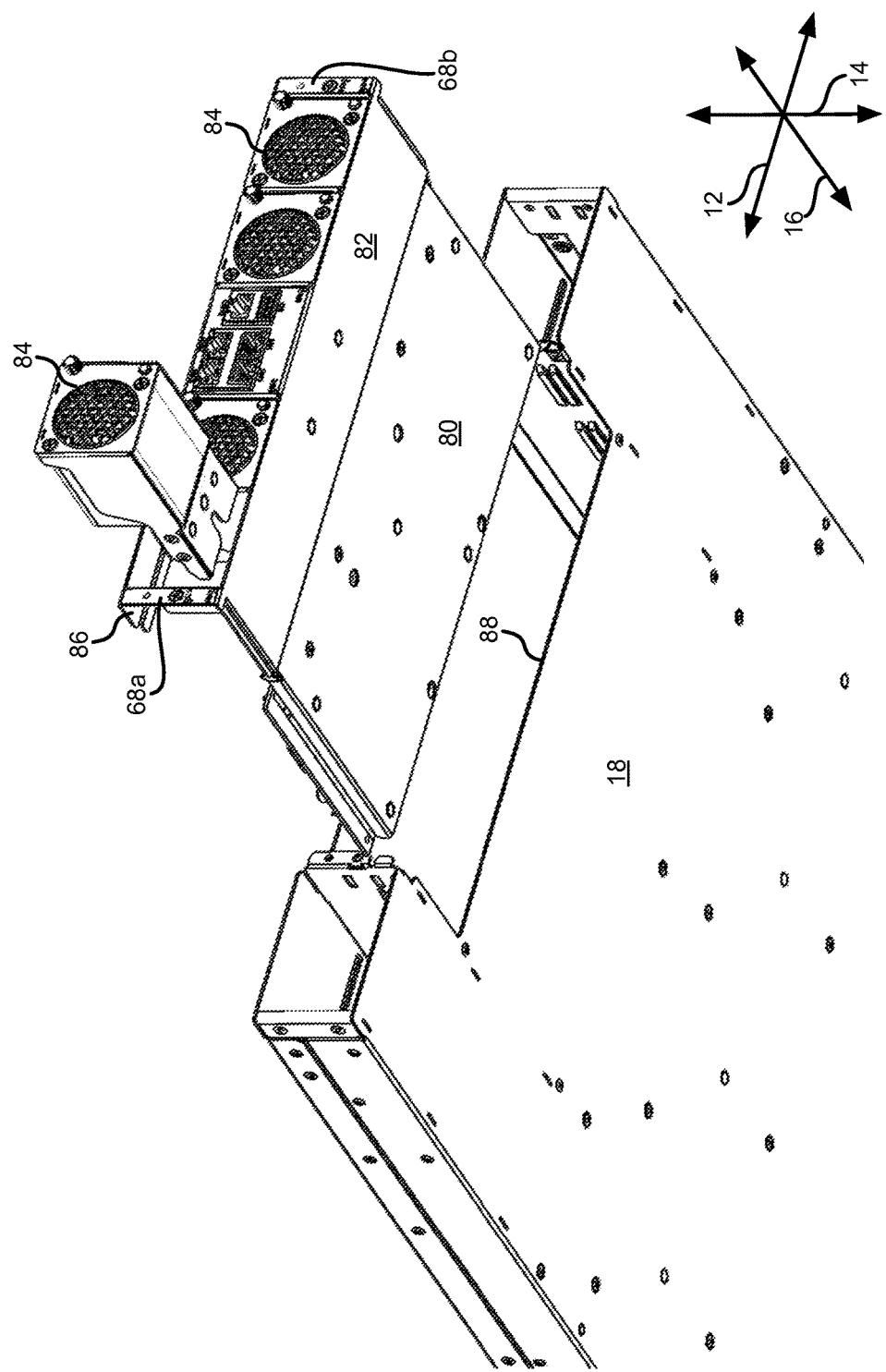
FIG. 4 is a lower isometric view illustrating insertion of the motherboard into the chassis in accordance with an embodiment of the present invention.

Referring to FIG. 4, the circuit board 62 may mount to a base plate 80. The base plate 80 may be made of sheet metal.

As is apparent in FIG. 4, the extent of the base plate 80 in the vertical direction 12 may be less than that of the circuit board 62, enabling the circuit board 62 to protrude outwardly for engaging the pairs of tabs 32.

The base plate 80 may include a recessed portion 82 that is offset outwardly from the remainder of the base plate 80 along the horizontal direction 14. The recessed portion 82 may define a place for the securement of various fan modules 84 to the motherboard 60.

In the illustrated embodiment, a cross bar 86 extends above the recessed portion 82. For example, faceplate 68 may be embodied as strips 68a, 68b extending from a back edge of the recessed portion 82 and connect to the cross bar 86 that extends between the strips 68a, 68b. The cross bar 86, strips 68a, 68b, recessed portion 82, and the remainder of the base plate 80 may be formed from a single sheet of metal bent and cut into the illustrated configuration.

Figure 5:
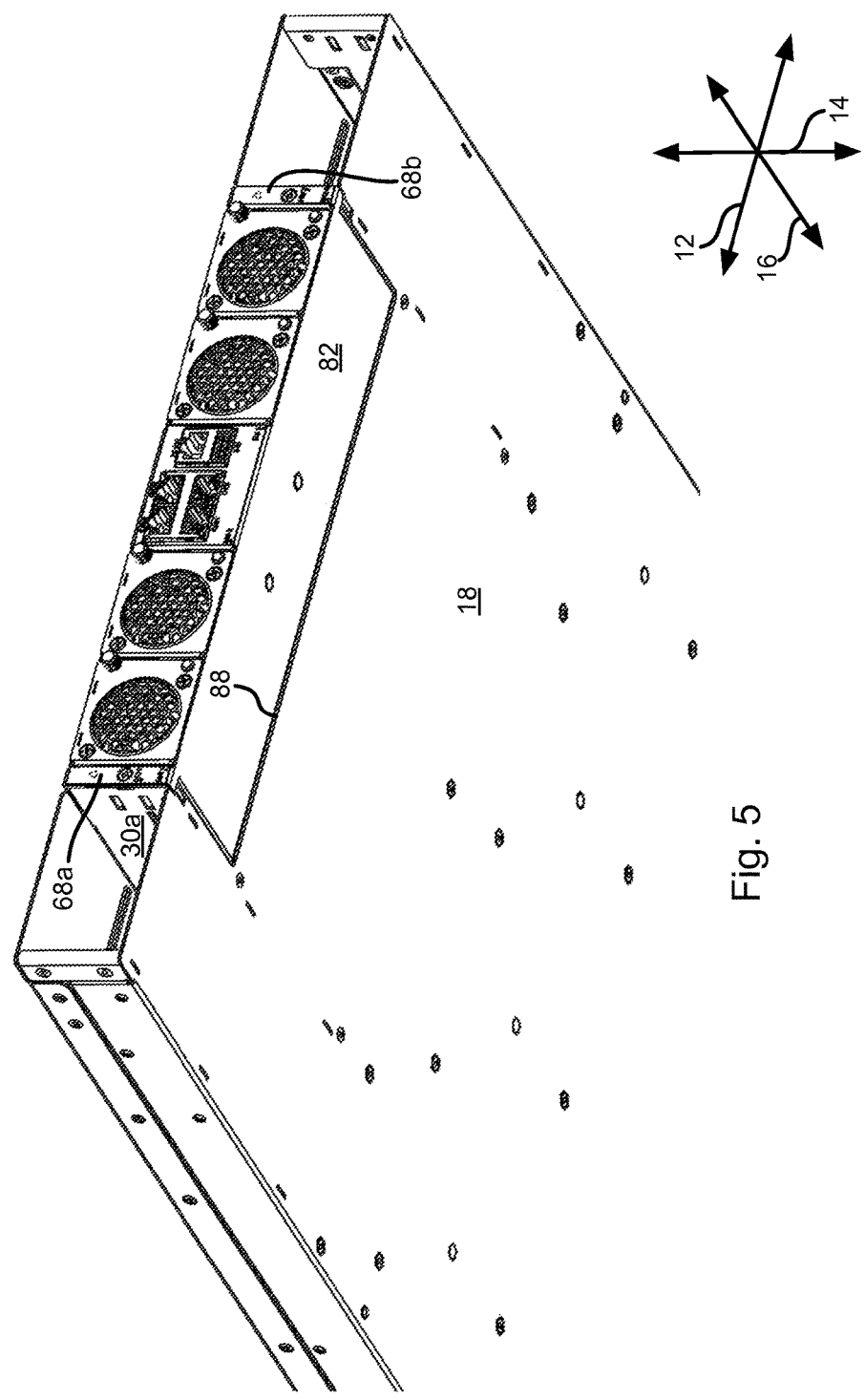
FIG. 5 is a lower isometric view illustrating insertion the motherboard inserted into the chassis in accordance with an embodiment of the present invention.
Figure 6:
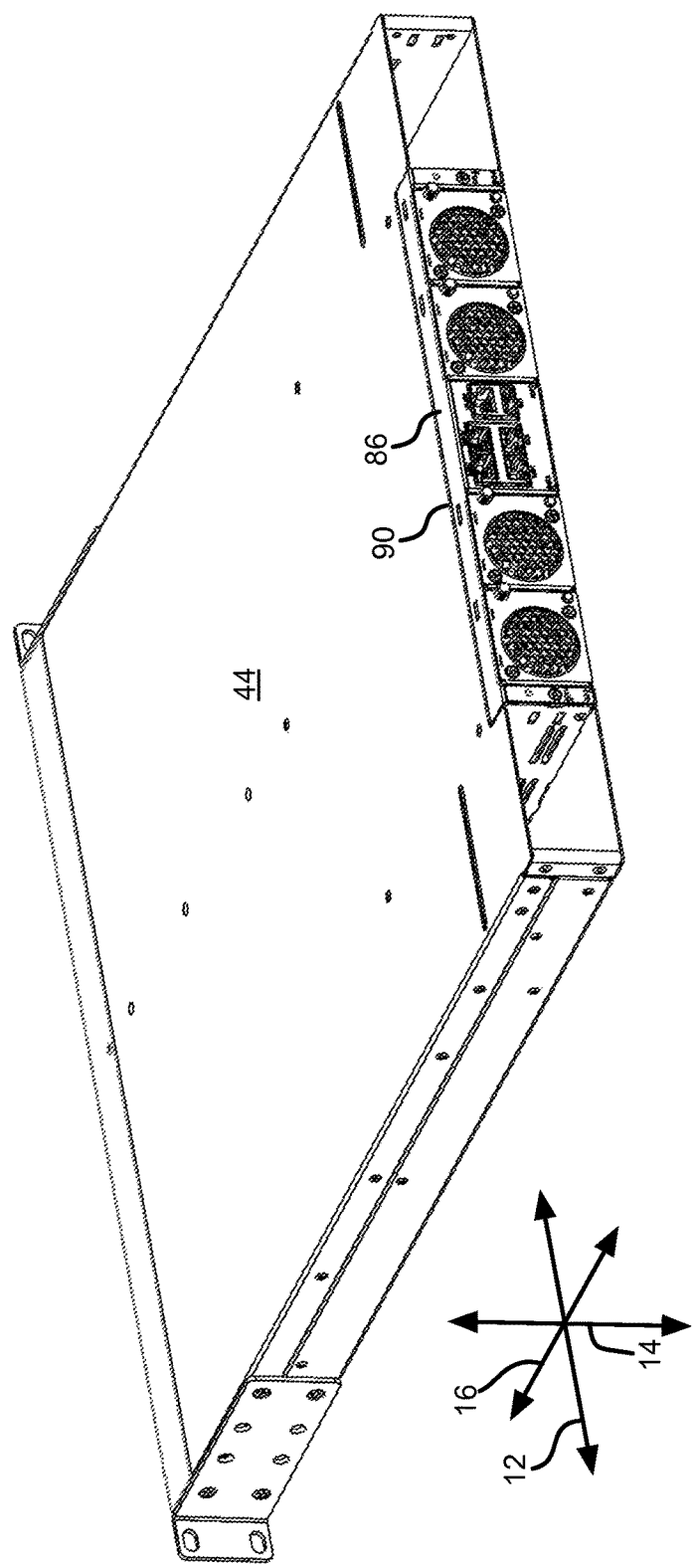
FIG. 6 is an isometric view illustrating the motherboard inserted into the chassis in accordance with an embodiment of the present invention.

In the illustrated embodiment, the left plate 18 defines a cutout 88 sized to receive the recessed portion 82. As shown in FIG. 5, when the motherboard 60 is fully inserted within the chassis 10, the recessed portion 82 is positioned within the cutout 88 and the left surface of the recessed portion is flush with the left surface of the left plate 18 in a plane parallel to the vertical and longitudinal directions 12, 16. As shown in FIG. 6, the cross bar 86 may fit within a cutout 90 in the right plate 44 such that a right surface of the cross bar 86 is flush with a right surface of the right plate 44 in a plane parallel to the vertical and longitudinal directions 12, 16.

Figure 8:
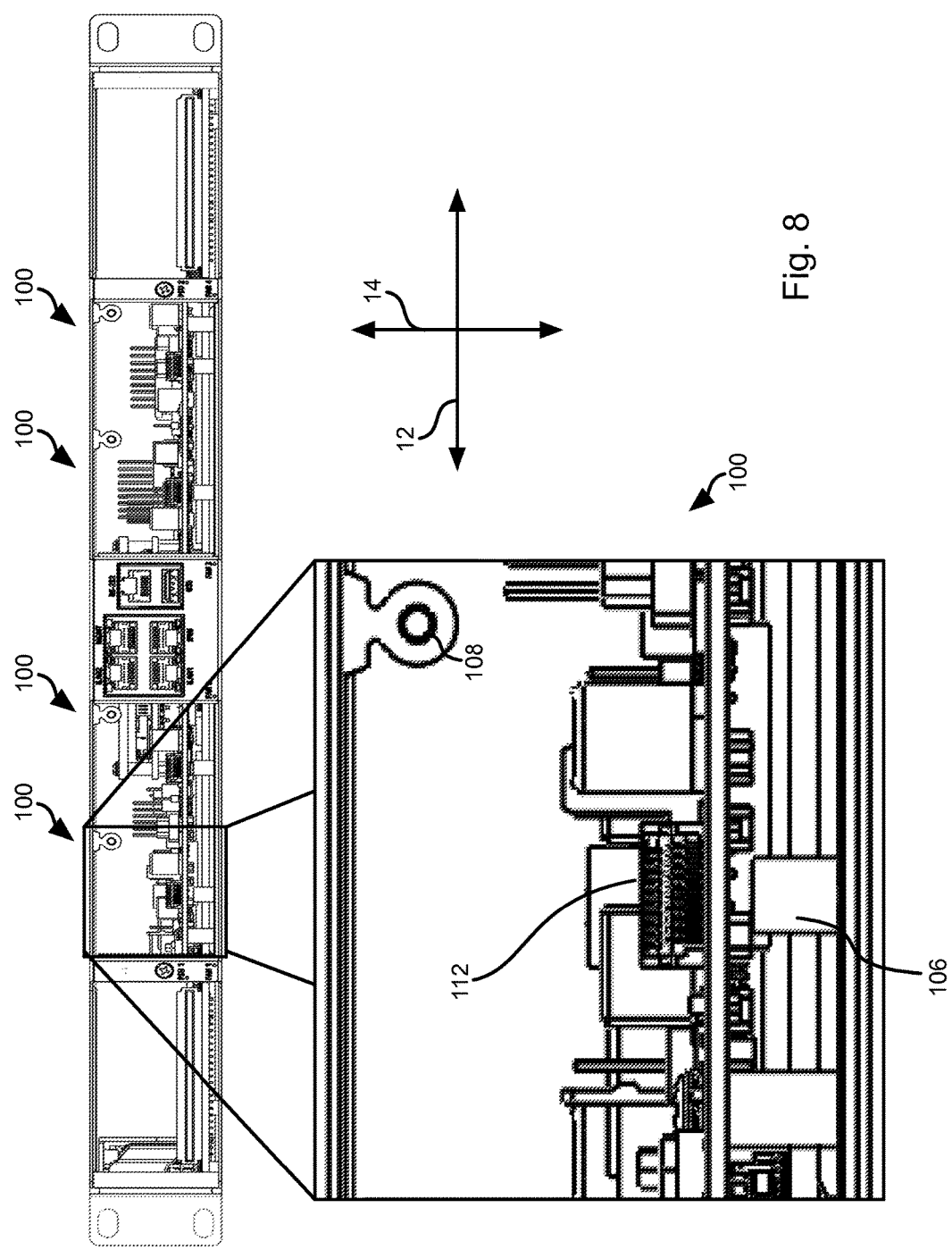
FIG. 8 is a rear view of the motherboard of FIG. 7.

Referring to FIGS. 7 and 8, the motherboard 60 may define a plurality of modular fan receivers 100. The receivers 100 may be distributed along rear surface of the motherboard 60 along the vertical direction 12. In the illustrated embodiment, a plate 102 is also positioned on the rear surface of the motherboard 60 and defines a plurality of ports 104, such as networking ports, display ports, USB ports, and the like. In the illustrated embodiment, the base plate 82 and face plate 102 are a monolithic sheet of metal bent into the illustrated configuration along with the cross bar 86. The fan receivers 100 may be positioned on either side of the plate 102 or all to one side of the plate 102.

Each receiver 100 may include an alignment post 106, a fastener receiver 108, such as a threaded fitting, and an edge connector 112 coupling electrical power, and possibly other signals, from the circuit board 62. The alignment post 106 may be positioned on an opposite side of the circuit board 62 from an edge connector 112 mounted to the circuit board 62. The alignment post 106 and edge connector 112 may be aligned with one another in the vertical direction such that a center of the post 106 is on the center of the edge connector 112 in the vertical direction. The post 106 may also be aligned with the edge connector in the longitudinal direction 16. For example, all or part portion of the post 106 may overlap the edge connector 112 in the longitudinal direction 16.

In the illustrated embodiment, the fastener receiver 108 mounts to the cross bar 86 at a location of each receiver 108. For example, the fastener receiver 108 may mount within a hole 110 formed in the cross bar 86.

FIGS. 9A and 9B illustrate fan modules 84 that may insert within the receivers 100. The fan module 84 may include a base plate 120 and a recessed portion 122 that is parallel to the base plate but offset inwardly from the base plate 120. The base plate 120 and recessed portion may be planar members parallel to the vertical and longitudinal directions 12, 14 when installed in the motherboard 60. In use, the base plate 120 may contact the recessed portion 82 of the base plate 80 and the recessed portion 122 contacts the base plate 80 inward from the recessed portion 82.

A faceplate 124 secures to the base plate 120 and extends outwardly therefrom in the horizontal direction 14. The faceplate 124 may define a screen or openings through which to draw or expel air. In some embodiments, side plates 126 extending in the horizontal and longitudinal directions 14, 16 may extend between the faceplate 124 and one or both of the baseplate 120 and recessed portion 122 in order to provide additional stiffness.

A fan 128 mounts to one or all of the faceplate 124, base plate 120, recessed portion 122, and side plates 126. In the illustrated embodiment, the fan 128 is mounted to the faceplate 124 by means of screws. The fan 128 may include a housing, fan blade, motor coupled to the fan blade, control electronics coupled to the motor, and/or any other components of a cooling fan for an electronic device as known in the art.

In some embodiments, a circuit board 130 is mounted to the recessed portion 122 and is coupled to the fan 128. As shown, the circuit board 130 may be offset from the recessed portion 122 in the horizontal direction 14 and may be parallel to the recessed portion 122. The fan 128 may define a flow direction of air through the fan when activated. In the embodiment of FIGS. 9A and 9B, the flow direction is parallel to the longitudinal direction 16 from the faceplate 124 toward the circuit board 130 or the reverse of that direction.

Wires 132 conveying power to the motor of the fan 128 may connect to the circuit board 130. Likewise, any sensors included in the fan 130 may be coupled to the circuit board 130 by wires 132. Any control circuits of the fan 138 for receiving commands or control signals to the fan 128 may also be coupled to the circuit board 130.

The circuit board 130 may include or have coupled thereto a connector 134 including one or more pins. The circuit board 130 may include circuits for coupling power and/or other signals from the pins of the connector 134 to the wires 132. In the illustrated embodiment, the connector 134 is a portion of the circuit board 130 protruding outwardly from the remainder of the circuit board 130.

The recessed portion 122 may include a notch 136 extending inwardly in the longitudinal direction 16 from a front edge of the recessed portion 122. The notch 136 may include a flared portion 138 that transitions to a straight-sided portion 140 inward from the flared portion 138, the straight sides of the straight-sided portion may be parallel to the longitudinal direction 16. As shown in FIG. 9A, the notch 136 may be aligned in the vertical direction 12 with the connector 134, such that center of the notch 136 in the vertical direction is aligned with the center of the connector 134 in the vertical direction 12. In this manner, the notch 136 facilitates alignment of the connector 134 with an edge connector 112, as described in greater detail below. The electrical connector 134 may be aligned with the notch 136 in the longitudinal direction 16 above, i.e. some or all of the notch 136 may be overlapped by the electrical connector 134 in the longitudinal direction 16. Some or all of the connector 134 may be overlapped by the notch 136 in the longitudinal direction 16.

A screw 142 may pass through the faceplate 124 such that a screw head 144 is exposed rearwardly from the faceplate 124 when the fan module 84 is mounted to the motherboard. The screw 142 engages the threaded fitting 108 effective to secure the fan module 84 in a receiver 100. The screw head may be large enough to be tightened by hand, i.e. a thumbscrew, or may have grooves or recesses sized to receive a conventional screw driver (slot, Philips, hex, torx, etc.).

Figure 10B:
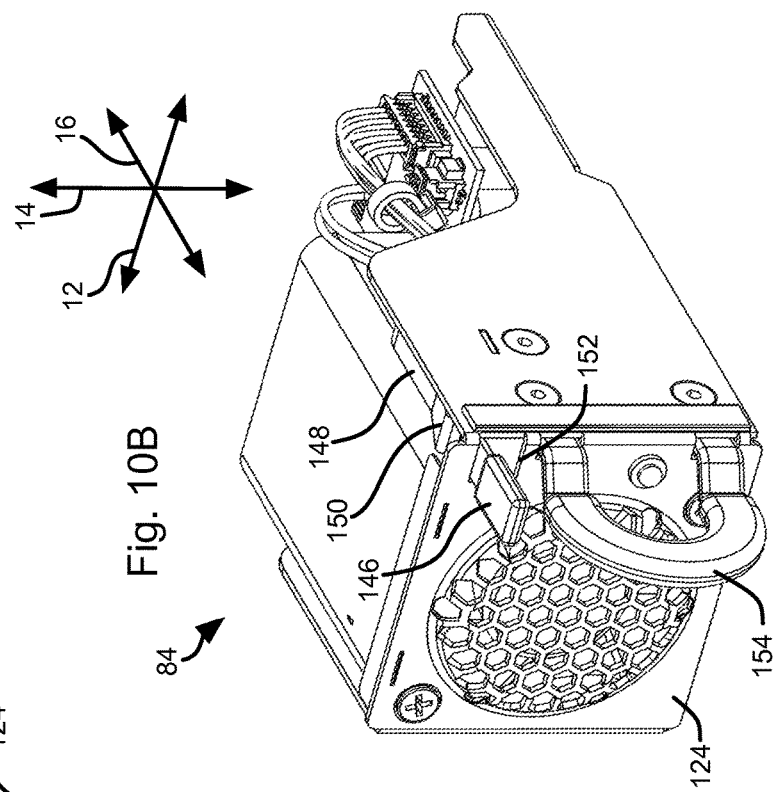
FIGS. 10A and 10B are isometric views of an alternative embodiment of a fan module in accordance with an embodiment of the present invention.
Figure 10A:
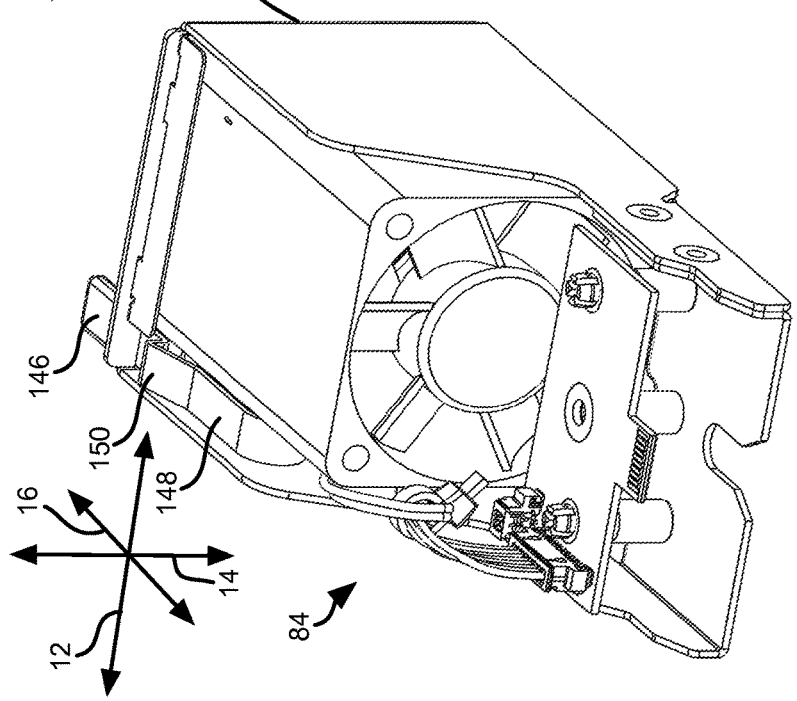

FIGS. 10A and 10B illustrate an alternative approach to fastening the fan modules 84 to the motherboard 60. In the illustrated embodiment, a handle 146 is mounted to a leaf spring 148. The leaf spring is located inwardly from the faceplate 124 and the handle protrudes outwardly form the faceplate on an opposite side of the faceplate 124, i.e. the handle protrudes rearwardly from the faceplate 14 in the longitudinal direction. The leaf spring 148 may define a sear 150 thereon. The cross bar 86 may include a flat surface projecting inwardly therefrom and facing forward in the longitudinal direction. In this manner, the leaf spring 148 will urge the sear 150 into engagement with the flat surface on the cross bar 86 and resist removal. Upon depressing of the handle 146 in the horizontal direction 14, the sear 150 may be disengaged from the flat surface thereby permitting removal. The faceplate 124 may define an opening 152 through which the handle 146 protrudes. The opening 152 may have an extent in the horizontal direction 14 enabling the handle to be depressed and disengage the sear 150.

In the embodiment of FIGS. 10A and 10B a handle 154 secures to the faceplate 124 or other portion of the fan module 84 to enable withdrawal of the fan module from the motherboard 60. A handle 154 may be included in the embodiment of FIGS. 9A and 9B as well.

Figure 11B:
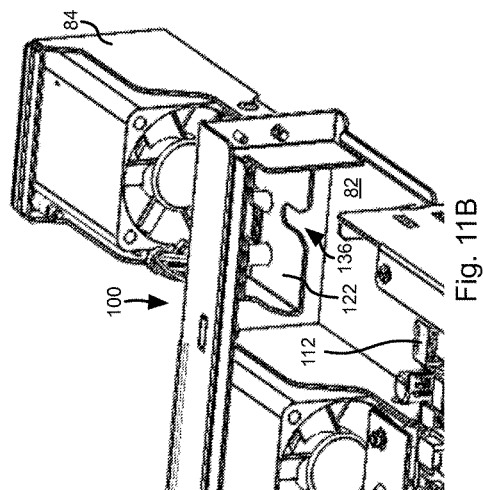
FIGS. 11A and 11B are isometric views illustrating the insertion of a fan module into a mother board in accordance with an embodiment of the present invention.
Figure 11A:
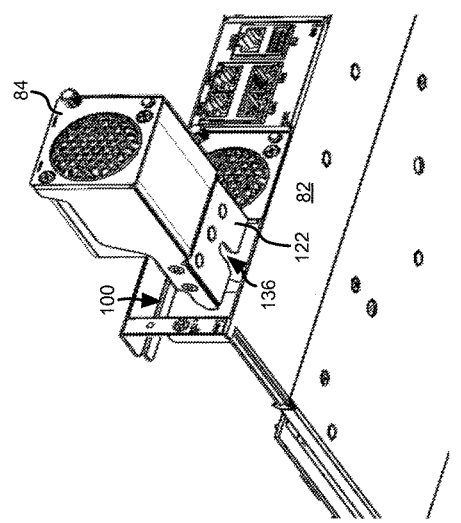

FIGS. 11A and 11B and FIGS. 12A to 12D illustrate the manner in which a fan module 84 may be engaged with a motherboard 60. As shown in FIGS. 11A and 11B, during insertion the fan module 84 is aligned with the fan module receiver 100 as illustrated having the notch 136 facing the receiver 100 and the recessed portion 122 parallel to the recessed portion 82, i.e. upper and lower surfaces thereof parallel to the recessed portion 82.

Figure 12A:
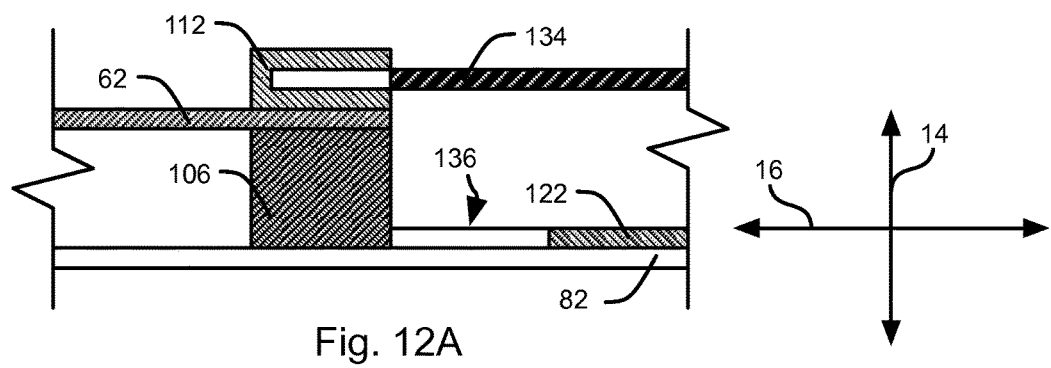
FIGS. 12A through 12D are views illustrating engagement of a fan module with a motherboard in accordance with an embodiment of the present invention.
Figure 12B:
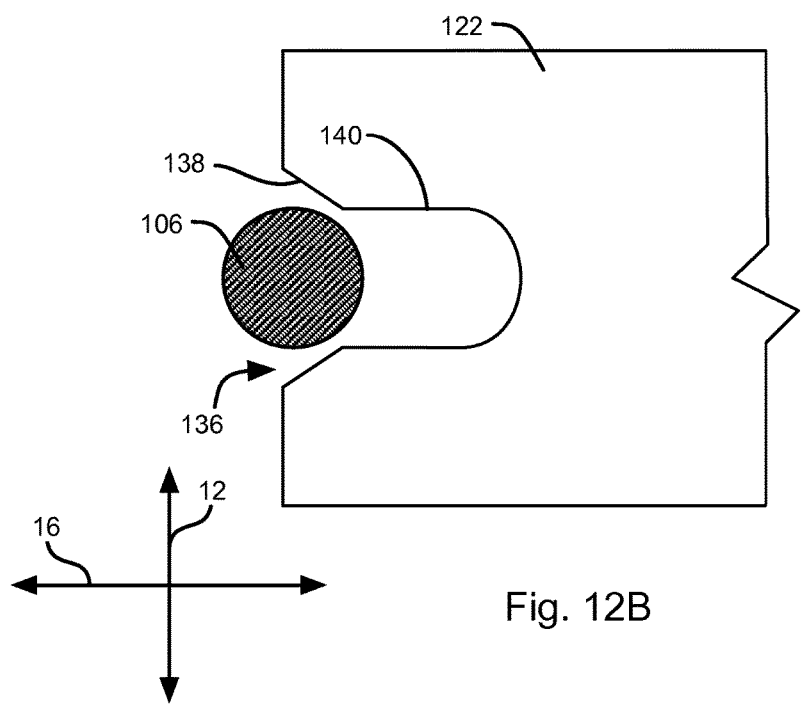
Figure 12C:
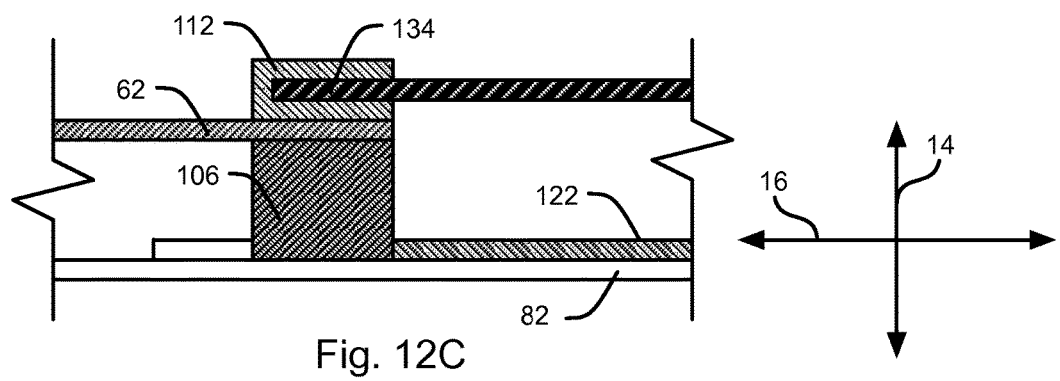
Figure 12D:
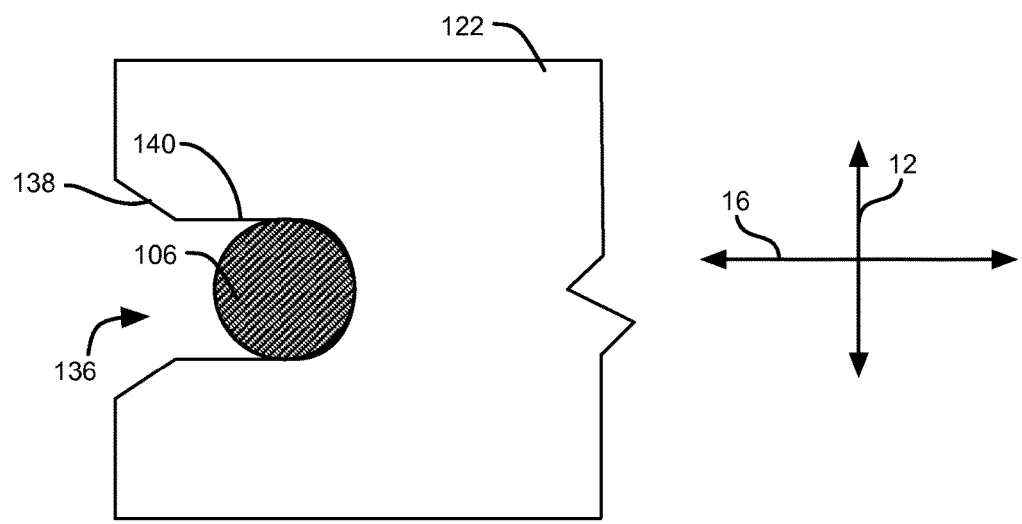

Referring to FIGS. 12A and 12B, as the fan module 84 is inserted the flared portion 138 of the notch 136 engages the alignment post 106. As the fan module 84 continues to be inserted, the flared portion 138 guides the alignment post into the straight portion 140. This aligns the connector 134 with the edge connector 112.

Referring to FIGS. 12A and 12B, as the fan module 84 continues toward the motherboard 60, the connector 134 inserts within the edge connector. As is apparent in FIGS. 12A and 12C, the recessed portion 122 may be in contact with the recessed portion 82 when the connector 134 is engaged with the edge connector 112.

The process of inserting a fan module 84 as illustrated in FIGS. 12A to 12D may be performed while the motherboard 60 is inserted within the chassis 10 or while the motherboard 60 is removed from the chassis 10. The removal of the fan module 84 is the reverse of the process illustrated in FIGS. 12A to 12D and may likewise be performed while the motherboard is inserted within the chassis 10 or removed therefrom. As is further apparent from the foregoing description, the fan modules 84 secure exclusively to the motherboard 60 and are therefore coupled to the chassis 10 exclusively due to their securement to the motherboard 60.

Figure 13:
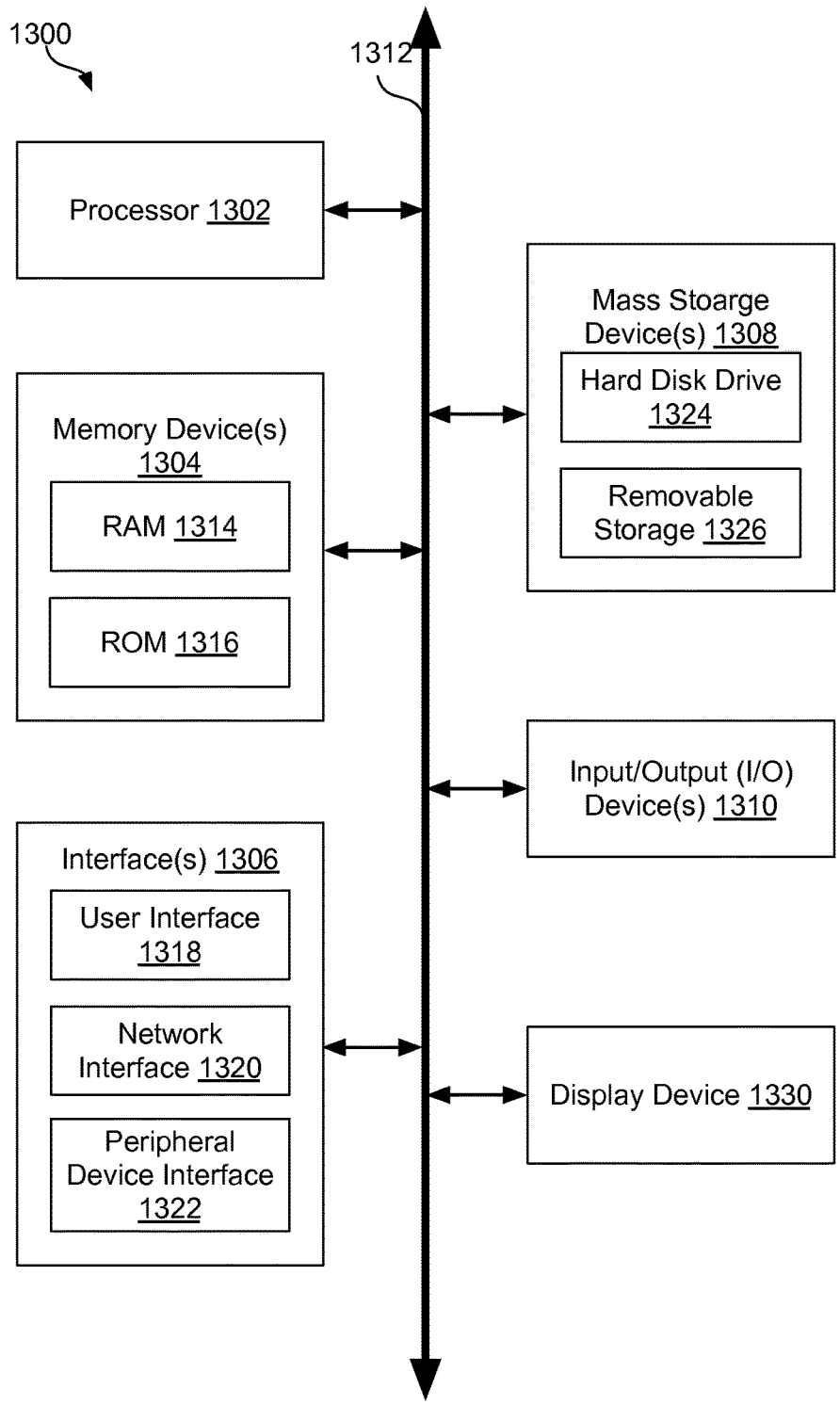
FIG. 13 is a schematic block diagram of a computing device that may be implemented by a motherboard.

FIG. 13 is a block diagram illustrating an example computing device 1300. The motherboard 60 may have some or all of the attributes of the computing device 1300 or be coupled to one or more peripheral devices to have the configuration of the computing device 1300. Computing device 1300 can function as a server, a client, or any other computing entity. Computing device can perform various monitoring functions as discussed herein, and can execute one or more application programs, such as the application programs described herein. Computing device 1300 can be any of a wide variety of computing devices, such as a desktop computer, a notebook computer, a server computer, a handheld computer, tablet computer and the like.

Computing device 1300 includes one or more processor(s) 1302, one or more memory device(s) 1304, one or more interface(s) 1306, one or more mass storage device(s) 1308, one or more Input/Output (I/O) device(s) 1310, and a display device 1330 all of which are coupled to a bus 1312. Processor(s) 1302 include one or more processors or controllers that execute instructions stored in memory device(s) 1304 and/or mass storage device(s) 1308. Processor(s) 1302 may also include various types of computer-readable media, such as cache memory.

Memory device(s) 1304 include various computer-readable media, such as volatile memory (e.g., random access memory (RAM) 1314) and/or nonvolatile memory (e.g., read-only memory (ROM) 1316). Memory device(s) 1304 may also include rewritable ROM, such as Flash memory.

Mass storage device(s) 1308 include various computer readable media, such as magnetic tapes, magnetic disks, optical disks, solid-state memory (e.g., Flash memory), and so forth. As shown in FIG. 13, a particular mass storage device is a hard disk drive 1324. Various drives may also be included in mass storage device(s) 1308 to enable reading from and/or writing to the various computer readable media. Mass storage device(s) 1308 include removable media 1326 and/or non-removable media.

I/O device(s) 1310 include various devices that allow data and/or other information to be input to or retrieved from computing device 1300. Example I/O device(s) 1310 include cursor control devices, keyboards, keypads, microphones, monitors or other display devices, speakers, printers, network interface cards, modems, lenses, CCDs or other image capture devices, and the like.

Display device 1330 includes any type of device capable of displaying information to one or more users of computing device 1300. Examples of display device 1330 include a monitor, display terminal, video projection device, and the like.

Interface(s) 1306 include various interfaces that allow computing device 1300 to interact with other systems, devices, or computing environments. Example interface(s) 1306 include any number of different network interfaces 1320, such as interfaces to local area networks (LANs), wide area networks (WANs), wireless networks, and the Internet. Other interface(s) include user interface 1318 and peripheral device interface 1322. The interface(s) 1306 may also include one or more user interface elements 1318. The interface(s) 1306 may also include one or more peripheral interfaces such as interfaces for printers, pointing devices (mice, track pad, etc.), keyboards, and the like.

Bus 1312 allows processor(s) 1302, memory device(s) 1304, interface(s) 1306, mass storage device(s) 1308, and I/O device(s) 1310 to communicate with one another, as well as other devices or components coupled to bus 1312. Bus 1312 represents one or more of several types of bus structures, such as a system bus, PCI bus, IEEE 1394 bus, USB bus, and so forth.

For purposes of illustration, programs and other executable program components are shown herein as discrete blocks, although it is understood that such programs and components may reside at various times in different storage components of computing device 1300, and are executed by processor(s) 1302. Alternatively, the systems and procedures described herein can be implemented in hardware, or a combination of hardware, software, and/or firmware. For example, one or more application specific integrated circuits (ASICs) can be programmed to carry out one or more of the systems and procedures described herein.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed is:

1. An apparatus comprising: a chassis defining a motherboard slot; a motherboard positioned in the motherboard slot, the motherboard defining a plurality of fan module receivers, each fan module receiver including a first electrical connector; and a plurality of fan modules, each fan module inserted within one fan module receiver and coupled to the first electrical connector thereof, wherein the motherboard includes a circuit board and the first electrical connector of each fan module receiver is an edge connector, the edge connectors of the plurality of fan module receivers being positioned along an edge of the circuit board, and wherein the edge connectors are mounted on a first surface of the circuit board and a plurality of alignment posts are mounted to the circuit board on a second surface opposite the first surface, each alignment post positioned directly opposite one of the edge connectors, each fan module including a slot positioned to receive one of the alignment posts and a second electrical connector positioned to engage one of the edge connectors positioned directly opposite the one of the alignment posts.

2. The apparatus of claim 1, wherein the fan modules are coupled to the chassis exclusively due to engagement with the motherboard positioned in the motherboard slot.

3. The apparatus of claim 1, wherein: each fan module receiver includes a threaded receiver; each fan module includes a faceplate including an aperture positioned to receive a threaded fastener engaging the threaded receiver of one of the fan module receivers when the each fan module is positioned within the one of the fan module receivers.

4. The apparatus of claim 3, wherein: the motherboard includes a face plate having a cross bar extending parallel to the edge of the circuit board and offset from the edge of the circuit board to define an opening between the cross bar and the edge of the circuit board, the plurality of edge connectors abutting the edge of the circuit board; the threaded receivers are mounted to the cross bar.

5. The apparatus of claim 1, wherein the chassis further comprises: a midplane including a motherboard socket, the motherboard being inserted within the motherboard socket; and a plurality of expansion sockets electrically connected to the motherboard socket, each expansion socket of the plurality of expansion sockets defining a plurality of connector pins arranged in one or more rows, each row of the one or more rows being coplanar and collinear with a corresponding row in the other expansion sockets of the plurality of expansion sockets.

6. The apparatus of claim 5, wherein: each expansion socket of the plurality of expansion sockets defines an opening having a long dimension and a narrow dimension perpendicular to the long dimension, the long dimension being larger than the narrow dimension; the one or more rows of connector pins of each expansion socket of the plurality of expansion sockets include first and second rows of connector pins, the first row of connector pins being positioned on a first side of an opening defined by the each socket and the second row of connector pins being positioned on a second side of the opening opposite the first side, the first and second sides being parallel to the long dimension; and the first rows of connector pins of the plurality of expansion sockets are collinear and coplanar with one another and the second rows of connector pins of the plurality of expansion sockets are collinear and coplanar with one another.

7. The apparatus of claim 5, wherein the motherboard socket faces an opposite direction from the plurality of expansion sockets.

8. The apparatus of claim 5, wherein: the motherboard slot is configured such that a circuit board of the motherboard inserted within the motherboard slot is parallel to a first plane; and wherein each row of the one or more rows of connector pins of the each expansion socket is coplanar with a corresponding row in the other expansion sockets of the plurality of expansion sockets in a plane parallel to the first plane.

9. An apparatus comprising: a fan unit defining a flow direction and including a housing, a fan, and a motor coupled to the fan; a base plate mounted to the housing and protruding outwardly from a first side of the housing parallel to the flow direction, the base plate defining a registration feature including a slot positioned outwardly from the housing; and an electrical connector electrically coupled to the motor and protruding outwardly from the first side of the housing parallel to the flow direction, the electrical connector and slot being concentric, wherein a motherboard includes a circuit board and an electrical connector receiver is an edge connector, the edge connectors of a plurality of fan module receivers being positioned along an edge of the circuit board, and wherein the edge connectors are mounted on a first surface of the circuit board and a plurality of alignment posts are mounted to the circuit board on a second surface opposite the first surface, each alignment post positioned directly opposite one of the edge connectors; and the slot positioned to receive one of the alignment posts when the electrical connector is engaged with one of the edge connectors positioned directly opposite the one of the alignment posts.

10. The apparatus of claim 9, wherein the electrical connector comprises a portion of a circuit board oriented parallel to the base plate.

11. The apparatus of claim 9, further comprising a motherboard defining a plurality of fan module receivers each configured to engage the baseplate and including the electrical connector receiver configured to engage the electrical connector when the baseplate is engaged.

12. The apparatus of claim 9, wherein: each fan module receiver includes a threaded receiver; a faceplate is secured to the baseplate and oriented perpendicular to the flow direction, the housing being mounted to the base plate by securing to the face plate; and a hand operable screw passes through the faceplate and engages the threaded receiver of one of the plurality of fan module.

13. The apparatus of claim 12, wherein: the motherboard includes a face plate having a cross bar extending parallel to the edge of the circuit board and offset therefrom to define an opening between the cross bar and the edge of the circuit board, the plurality of edge connectors abutting the edge of the circuit board; the threaded receivers are mounted to the cross bar.

14. A method comprising: providing a chassis defining a motherboard slot; inserting a motherboard in the motherboard slot, the motherboard defining a plurality of fan module receivers, each fan module receiver including a first electrical connector; and inserting at least one fan module into at least one of the plurality of fan module receivers, each fan module inserted within one fan module receiver and coupled to the first electrical connector thereof, wherein the motherboard includes a circuit board and the first electrical connector of each fan module receiver is an edge connector, the edge connectors of the plurality of fan module receivers being positioned along an edge of the circuit board, and wherein the edge connectors are mounted on a first surface of the circuit board and a plurality of alignment posts are mounted to the circuit board on a second surface opposite the first surface, each alignment post positioned directly opposite one of the edge connectors, each fan module including a slot positioned to receive one of the alignment posts and a second electrical connector positioned to engage one of the edge connectors positioned directly opposite the one of the alignment posts.

15. The method of claim 14, further comprising removing one of the fan modules while the motherboard is engaged with the slot.

16. The method of claim 15, further comprising inserting one of the fan modules while the motherboard is engaged with the slot.

* * * * *